United States Patent
Beaupre et al.

(10) Patent No.: US 7,898,807 B2
(45) Date of Patent: Mar. 1, 2011

(54) METHODS FOR MAKING MILLICHANNEL SUBSTRATE, AND COOLING DEVICE AND APPARATUS USING THE SUBSTRATE

(75) Inventors: Richard Alfred Beaupre, Pittsfield, MA (US); Ljubisa Dragoljub Stevanovic, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 23 days.

(21) Appl. No.: 12/400,067

(22) Filed: Mar. 9, 2009

(65) Prior Publication Data
US 2010/0226093 A1 Sep. 9, 2010

(51) Int. Cl.
H05K 7/20 (2006.01)

(52) U.S. Cl. ............... 361/699; 361/679.53; 361/700; 165/80.4; 29/890.03; 29/890.039; 29/890.09

(58) Field of Classification Search ............ 361/679.46, 361/679.53, 688, 689, 699–701, 704–717; 165/80.3, 80.4, 80.5, 104.33, 104.34, 133, 165/168, 169, 170, 126, 135, 136, 139, 174, 165/175, 185; 257/207, 714, 716, 718, 722, 257/688; 174/15.1, 16.1, 16.3, 252, 250, 174/255, 261, 157; 62/3.2, 3.7, 259.2, 113, 62/114, 117, 233, 52.1, 238.6, 419, 228, 62/79, 61; 438/694, 700; 137/827, 833; 29/890.03, 890.039, 890.09
See application file for complete search history.

(56) References Cited

U.S. PATENT DOCUMENTS

| | | | |
|---|---|---|---|
| 5,005,640 A * | 4/1991 | Lapinski et al. | 165/170 |
| 5,099,311 A * | 3/1992 | Bonde et al. | 165/80.4 |
| 5,142,441 A * | 8/1992 | Seibold et al. | 361/689 |
| 5,692,558 A | 12/1997 | Hamilton et al. | |
| 5,876,582 A | 3/1999 | Frazier | |
| 5,901,037 A * | 5/1999 | Hamilton et al. | 361/699 |
| 6,014,312 A | 1/2000 | Schulz-Harder et al. | |
| 6,101,715 A * | 8/2000 | Fuesser et al. | 29/890.03 |
| 6,166,937 A * | 12/2000 | Yamamura et al. | 363/141 |
| 6,253,835 B1 * | 7/2001 | Chu et al. | 165/80.4 |
| 6,344,686 B1 | 2/2002 | Schaeffer et al. | |
| 6,373,705 B1 * | 4/2002 | Koelle et al. | 361/720 |
| 6,377,457 B1 * | 4/2002 | Seshan et al. | 361/690 |
| 6,388,317 B1 * | 5/2002 | Reese | 257/713 |
| 6,490,159 B1 * | 12/2002 | Goenka et al. | 361/700 |
| 6,582,987 B2 | 6/2003 | Jun et al. | |
| 6,586,783 B2 * | 7/2003 | Boursat et al. | 257/207 |
| 6,903,929 B2 | 6/2005 | Prasher et al. | |
| 6,986,382 B2 * | 1/2006 | Upadhya et al. | 165/80.4 |

(Continued)

FOREIGN PATENT DOCUMENTS

WO WO03003520 A2 * 1/2003

*Primary Examiner* — Michael V Datskovskiy
(74) *Attorney, Agent, or Firm* — Scott J. Asmus

(57) ABSTRACT

A substrate for power electronics mounted thereon, comprises a middle ceramic layer having a lower surface and an upper surface, an upper metal layer attached to the upper surface of the middle ceramic layer, and a lower metal layer attached to the lower surface of the middle ceramic layer. The lower metal layer has a plurality of millichannels configured to deliver a coolant for cooling the power electronics, wherein the millichannels are formed on the lower metal layer prior to attachment to the lower surface of the middle ceramic layer. Methods for making a cooling device and an apparatus are also presented.

14 Claims, 6 Drawing Sheets

U.S. PATENT DOCUMENTS

| | | | |
|---|---|---|---|
| 6,991,024 B2 * | 1/2006 | Goodson et al. | 165/80.4 |
| 7,141,741 B2 * | 11/2006 | Yamada et al. | 174/255 |
| 7,189,449 B2 * | 3/2007 | Osanai et al. | 428/210 |
| 7,277,284 B2 * | 10/2007 | Lee et al. | 361/699 |
| 7,353,859 B2 | 4/2008 | Stevanovic et al. | |
| 7,427,566 B2 * | 9/2008 | Durocher et al. | 438/689 |
| 7,476,606 B2 * | 1/2009 | Tran et al. | 438/605 |
| 2003/0156969 A1 * | 8/2003 | Choi et al. | 420/560 |
| 2004/0080055 A1 * | 4/2004 | Jiang | 257/783 |
| 2005/0141195 A1 | 6/2005 | Pokharna et al. | |
| 2006/0108098 A1 * | 5/2006 | Stevanovic et al. | 165/80.4 |
| 2007/0007280 A1 * | 1/2007 | Bayerer | 219/604 |
| 2007/0045801 A1 * | 3/2007 | Sugiyama et al. | 257/684 |
| 2007/0215325 A1 * | 9/2007 | Solovitz et al. | 165/80.4 |
| 2007/0235744 A1 * | 10/2007 | Tran et al. | 257/94 |
| 2008/0079021 A1 | 4/2008 | Bayerer et al. | |

* cited by examiner

METHODS FOR MAKING MILLICHANNEL SUBSTRATE, AND COOLING DEVICE AND APPARATUS USING THE SUBSTRATE

BACKGROUND

Many high performance power electronics require cooling devices to prevent them from overheating so as to improve reliability and efficiency thereof. One method for cooling such power electronics is by utilizing heat sinks. The heat sinks operate by transferring the heat away from the power electronics thereby maintaining a lower temperature of the power electronics. There are various types of heat sinks known in thermal management fields including air cooled and liquid cooled devices.

Typically, the heat sink is made up electrically conductive material. Therefore, the power electronics may be coupled to the heat sink with a substrate disposed therebetween to avoid generation of short circuit, which can damage the power electronics. The substrate generally includes an electrically isolating and thermal conductive layer, such as a ceramic layer. In order to attach the ceramic layer to the heat sink and the power electronics, the substrate further includes metal, such as copper brazed or bonded to upper and lower surfaces of the ceramic layer to perform surface treatment to the ceramic layer.

The surface treatment process is typically performed at a high temperature, such as 600° C. to 1000° C. Thus, metal patterns and thickness should be controlled to prevent mechanical distortion as the substrate is cooled to room temperature. The cooling may result in mechanical residual stress at the metal to ceramic interfaces due to the difference in coefficient of thermal expansion (CTE) between the metal and the ceramic layer. For example, the ceramic layer includes aluminum nitride ceramic whose CTE is 4 ppm/° C., and the CTE of the copper metal is 17 ppm/° C.

Additionally, the substrate is formed with a plurality of millichannels on the lower metal for a coolant passing through. However, fabricating the microchannels in the bottom metal of the substrate may relieve some of the residual stress due to removal of the metal. Consequently, the substrate may be deformed.

It is desirable to have a planar substrate for bonding the substrate to the heatsink and the power electronics. Particularly, when the non-planar substrate is bonded to the heatsink at a higher temperature about 250° C., the substrate deforms more and the bond to the heatsink can not be achieved.

Therefore, there is a need for new and improved methods for making millichannel substrate, and cooling device and apparatuses using the millichannel substrate.

BRIEF DESCRIPTION

A substrate for power electronics mounted thereon is provided in accordance with one embodiment of the invention. The substrate comprises a middle ceramic layer having a lower surface and an upper surface, an upper metal layer attached to the upper surface of the middle ceramic layer, and a lower metal layer attached to the lower surface of the middle ceramic layer. The lower metal layer has a plurality of millichannels configured to deliver a coolant for cooling the power electronics, and the millichannels are formed on the lower metal layer prior to attachment to the lower surface of the middle ceramic layer.

A method for making a cooling device is provided in accordance with another embodiment of the invention. The method comprises defining a plurality of millichannels on a first layer and forming a substrate. The forming a substrate comprises attaching the first layer having the millichannels to a lower surface of a second layer, and attaching a third layer to an upper surface of the second layer. The method further comprises attaching the substrate to a base plate so that the first layer is coupled to the base plate, wherein the base plate is configured to cooperate with the substrate to pass a coolant through the millichannels.

An embodiment of the invention further provides a method for making an apparatus having a substrate with millichannel cooling, wherein the step of making the substrate comprises defining a plurality of millichannels on a first layer, attaching the first layer having the millichannels to a lower surface of a second layer, and attaching a third layer to an upper surface of the second layer. The method further comprises attaching the substrate to a base plate so that the first layer is coupled to the base plate, and attaching a power electronics to the third layer. The base plate is configured to cooperate with the substrate to pass a coolant through the millichannels.

BRIEF DESCRIPTION OF THE DRAWINGS

The above and other aspects, features, and advantages of the present disclosure will become more apparent in light of the following detailed description when taken in conjunction with the accompanying drawings in which.

DETAILED DESCRIPTION

Various embodiments of the present disclosure are described herein with reference to the accompanying drawings. This description relates generally to methods for making substrates, and cooling devices and apparatuses using millichannel substrates. The description also relates to millichannel substrates and methods for making millichannel substrates.

Figure 1:
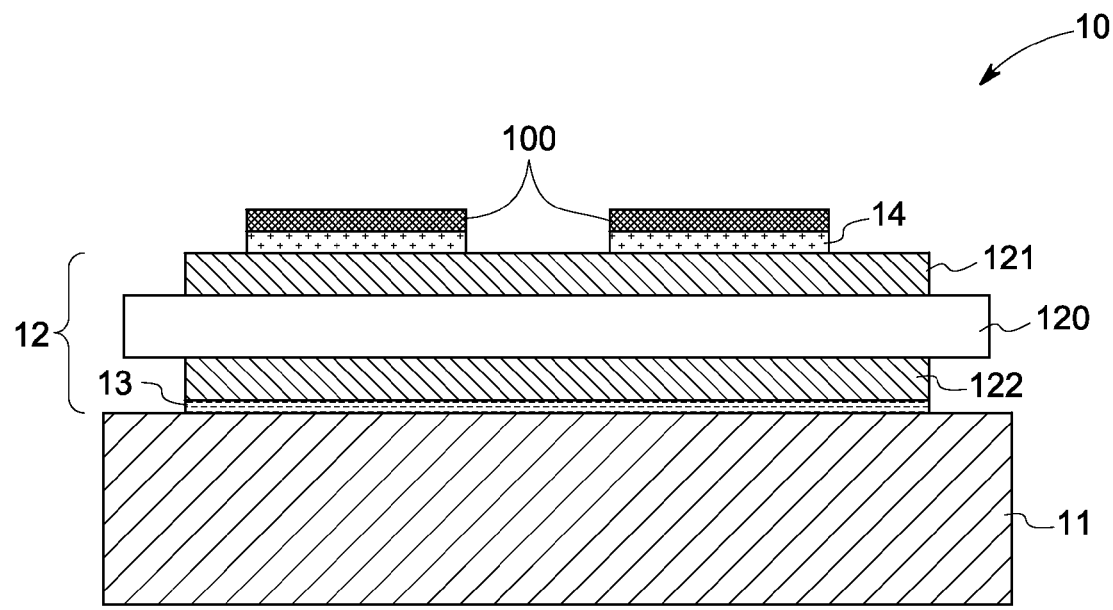
FIG. 1 is a schematic diagram of an apparatus comprising power electronics, a substrate, and a base plate in accordance with one embodiment of the invention.
Figure 2:
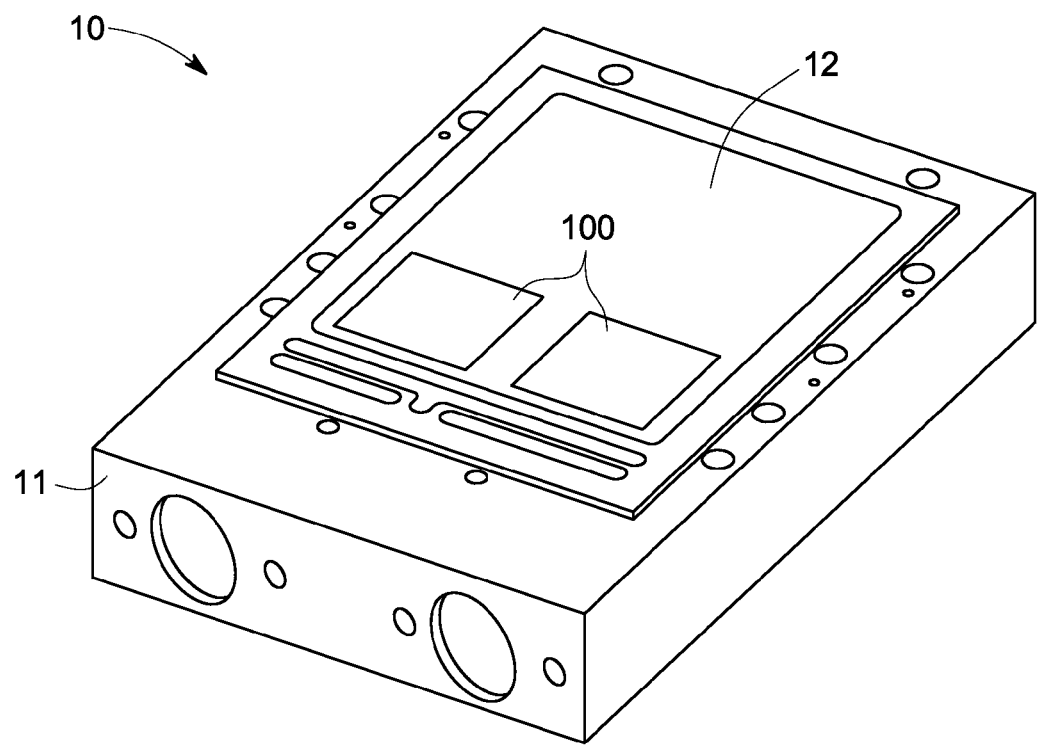
FIG. 2 is an assembled perspective diagram of the apparatus in accordance with one embodiment of the invention.

As illustrated in FIGS. 1-2, an apparatus 10 comprises a base plate 11, a substrate 12 coupled on the base plate 11, and at least one heat source 100, such as power electronics coupled on the substrate 12, together forming a stack configuration. The base plate 11 and the substrate 12 cooperate with each other to direct one or more coolants to cool the heat source 100.

In certain embodiments, non-limiting examples of the coolant comprise de-ionized water and other non-electrically conductive liquids. Non-limiting examples of the power electronics or heat source 100 may include Insulated Gate Bipolar Transistors (IGBT), Metal Oxide Semiconductor Field Effect Transistors (MOSFET), Diodes, Metal Semiconductor Field Effect Transistors (MESFET), and High Electron Mobility Transistors (HEMT). The millichannel substrate embodiments find applications to the power electronics manufactured from a variety of semiconductors, non-limiting examples of which include silicon (Si), silicon carbide (SiC), gallium nitride (GaN), and gallium arsenide (GaAs).

In the arrangement in FIG. 1, the substrate 12 may be attached to the baseplate 11 and the power electronics 100 using a number of techniques, including but not limited to, brazing, bonding, diffusion bonding, soldering, or pressure contact such as clamping, which provides a simple assembly process, which reduces the overall cost of the apparatus 10. As indicated in FIG. 1, in some non-limiting examples, the apparatus 10 may further comprise a first solder 13 configured to attach the low layer 122 to the base plate 11, and a second solder 14 configured to attach the power electronics 100 to the upper layer 121. According to certain applications, the solders 13, 14 may not be employed.

Figure 3:
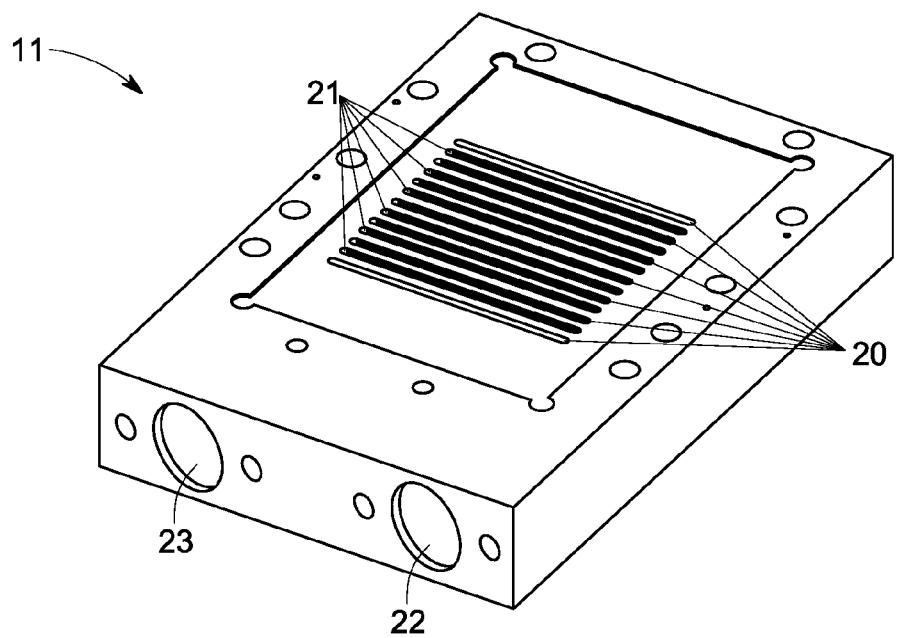
FIG. 3 is a perspective diagram of the base plate show in FIG. 2.
Figure 4:
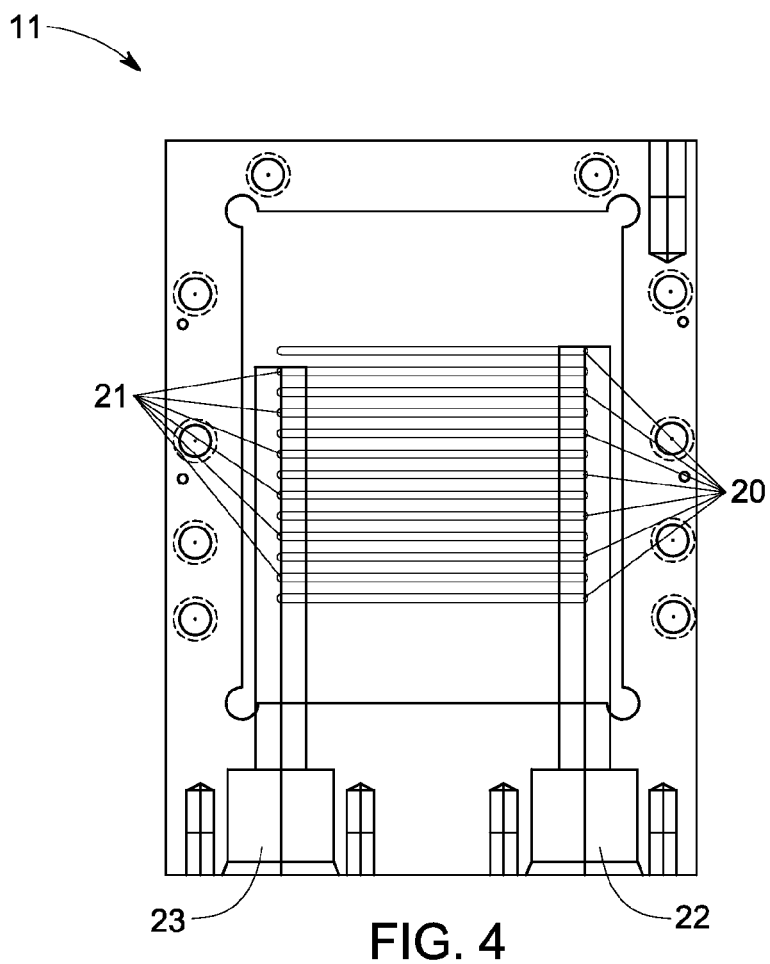
FIG. 4 is a planar diagram of the base plate shown in FIG. 3.

FIG. 3 illustrates a perspective diagram of the base plate 11. FIG. 4 illustrates a planar diagram of the base plate 11 shown in FIG. 3. As illustrated in FIGS. 3-4, the base plate 11 is a cubic shape, and defines a plurality of inlet manifolds 20 and a plurality of outlet manifolds 21, each is recessed downwardly from an upper surface (not labeled) of the base plate 11. In some examples, the base plate 11 may be other shape. In embodiments of the invention, the inlet manifolds 20 are configured to receive a coolant, and the outlet manifolds 21 are configured to exhaust the coolant. In one non-limiting example, the inlet manifolds 20 and the outlet manifolds 21 are interleaved.

For the embodiment in FIGS. 3-4, there is one more inlet manifold 20 than the outlet manifold 21 in order to preserve symmetry of the coolant flow. Alternatively, there may be one more outlet manifold 21 than the inlet manifold 20. In the exemplary embodiment, the base plate 11 further comprises an inlet plenum 22 and an outlet plenum 23. The inlet plenum 22 is configured to communicate fluidly with the inlet manifolds 20, and the outlet plenum 23 is configured to communicate fluidly with the outlet manifolds 21. Thus, the coolant can enter into the base plate 11 from the inlet plenum 22 and flow out of the base plate 11 from the outlet plenum 23.

In some non-limiting examples, diameters of the inlet and outlet plenums 22, 23 may be larger than diameters of the inlet and outlet manifolds 20, 21. Thus, there is no significant pressure-drop in the plenums. Other discussion of the channels is disclosed in U.S. Pat. No. 7,353,859, which is incorporated herein by reference.

In certain embodiments, the baseplate 11 may comprise at least one thermally conductive material, non-limiting examples of which may include copper, aluminum, nickel, molybdenum, titanium, and alloys thereof. In some examples, the baseplate 11 may also comprise at least one thermally conductive material, non-limiting examples of which may include thermo pyrolytic graphite (TPG). In other examples, the baseplate 11 may also comprise at least one thermally conductive material, non-limiting examples of which may include metal matrix composites such as aluminum silicon carbide (AlSiC), aluminum graphite, or copper graphite. Alternatively, the baseplate 11 may also comprise at least one thermally conductive material, non-limiting examples of which may include ceramics such as aluminum oxide, aluminum nitride, or silicon nitride ceramic. In certain examples, the baseplate 11 may include at least one thermoplastic material.

Figure 5A:
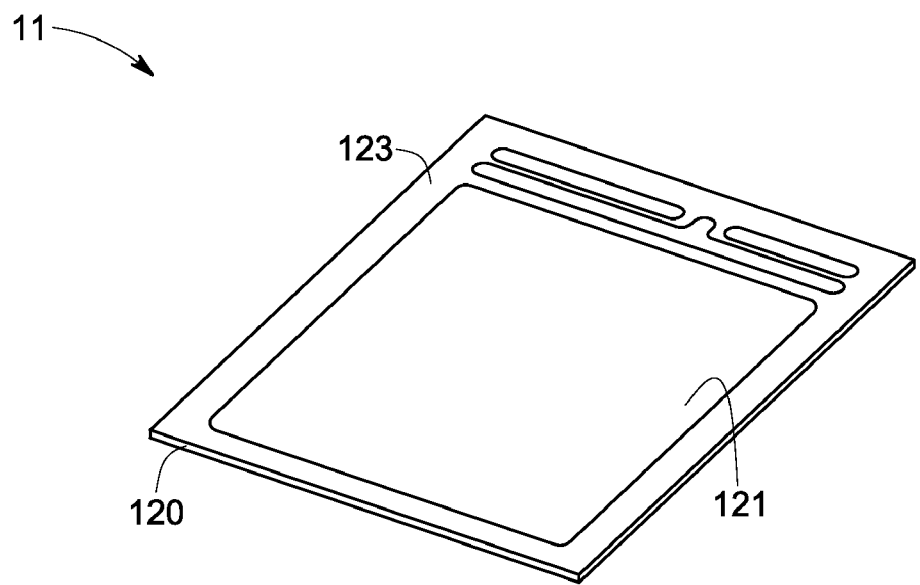
FIGS. 5(a)-5(b) are an top view perspective and a bottom view perspective of the substrate shown in FIG. 2.
Figure 5B:
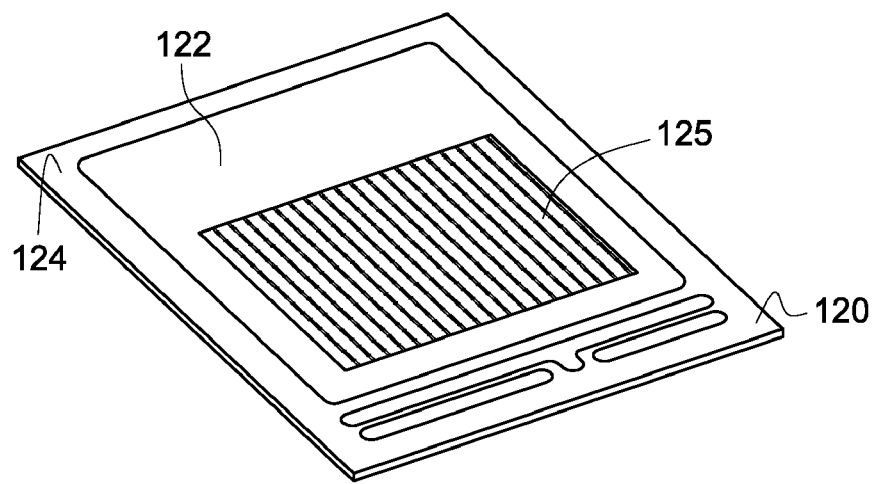

FIGS. 5(a)-5(b) show a top view perspective and a bottom view perspective of the substrate 12. As illustrated in FIGS. 5(a)-5(b), the substrate 12 comprises the lower layer 122 (a first layer), a middle layer 120 (a second layer), and the upper layer 121 (a third layer). The middle layer 120 comprises an upper surface 123 and a lower surface 124 opposite to the upper surface 123. The upper layer 121 is coupled to the upper surface 123, and the lower layer 122 is coupled to the lower surface 124. For the arrangement in FIG. 1, the substrate 12 is coupled to the base plate 11 by attaching the lower layer 122 to the base plate 11. The power electronics 100 are coupled to the substrate 12 by attaching the power electronics 100 to the upper layer 121.

In some embodiments, for the arrangements in FIGS. 5(a)-5(b), the middle layer 120 may comprises at least one electrically isolating and thermally conductive layer. The upper layer 121 and lower layer 122 may comprise at least one conductive material, respectively. In one non-limiting example, the middle layer 120 is a ceramic layer, and the upper and lower layers 121, 122 may comprise metal, such as copper attached to the upper surface 123 and the lower surface 124 of the ceramic layer 120. Thus, the substrate 12 may have either a direct bonded copper (DBC), or an active metal braze (AMB) structure. The DBC and AMB refer to processes which copper layers are directly bonded to a ceramic layer.

Non-limiting examples of the ceramic layer 120 may comprise aluminum oxide ($AL_2O_3$), aluminum nitride (AlN), beryllium oxide (BeO), and silicon nitride ($Si_3N_4$). Both the DBC and the AMB may be convenient structures for the substrate 12, and the use of the conductive material (in this case, copper) on the ceramic layer 120 may provide thermal and mechanical stability. Alternatively, the conductive layer 121, 122 may include other materials, but not limited to, aluminum, gold, silver, and alloys thereof according to different applications.

Figure 7:
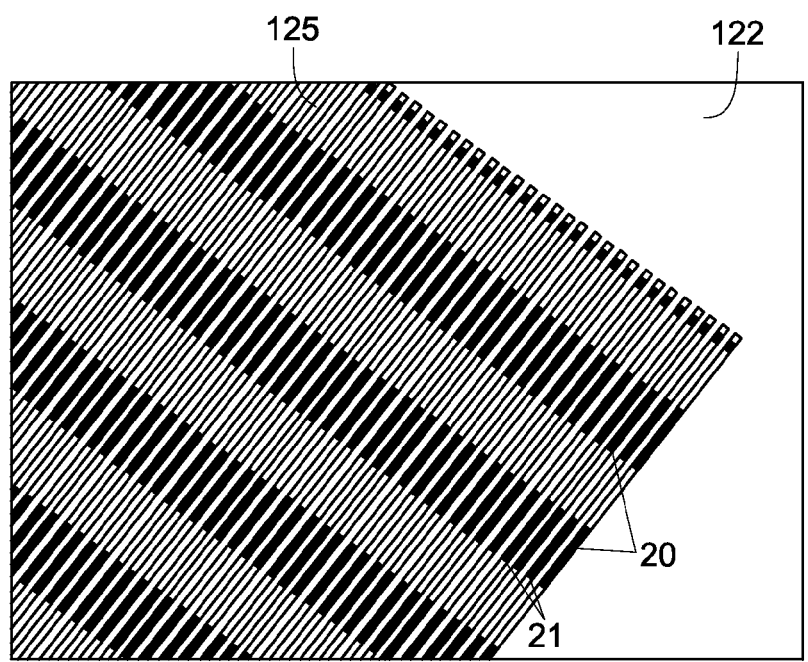
FIG. 7 is an enlarged schematic diagram showing cooperation of the lower layer and the base plate.

For the arrangement in FIG. 5(b), the lower layer 122 defines a plurality of millichannels 125 arranged parallel to each other and configured to communicate fluidly with the inlet and outlet manifolds 20, 21 (shown in FIG. 7). In one non-limiting example, the millichannels 125 may pass through the lower layer 122 to form through-hole configuration (shown in FIG. 7) on the lower layer 122. That is, the millichannel depth may be equal to the thickness of the lower layer 122. Alternatively, in other examples, the millichannels 125 may not pass through the lower layer 122 so as to form a plurality of trenches on the lower layer 122.

Figure 6:
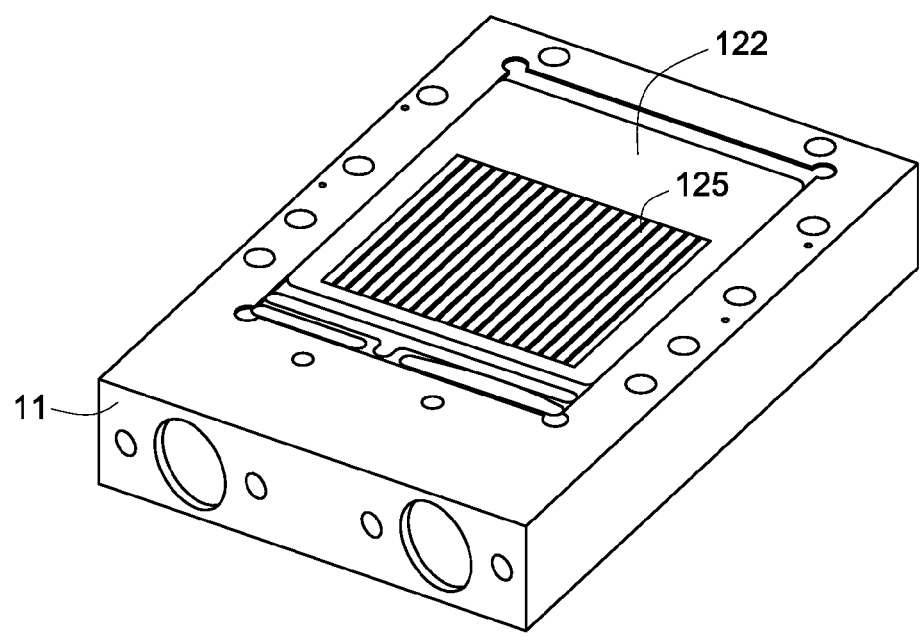
FIG. 6 is a schematic diagram showing cooperation of a lower layer of the substrate and the base plate.

FIG. 6 illustrates a schematic diagram showing cooperation of the lower layer 122 and the base plate 11. FIG. 7 illustrated an enlarged diagram of a portion of the cooperation of the lower layer 122 and the base plate 11. It should be noted that this configuration is only illustrative, and in certain examples, the lower 122 may contact the base plate 11 after the substrate 12 is formed. As illustrated in FIGS. 6-7, the millichannels 125 are oriented substantially perpendicular to and in fluid communication with the inlet and outlet manifolds 20, 21. As used herein the term "oriented substantially perpendicular" should be understood to mean that the millichannels 125 may be oriented at angles of about ninety degrees plus/minus about thirty degrees (90+/−30 degrees) relative to the inlet and outlet manifolds 20, 21. In other examples, the millichannels 125 may be oriented at angles of about ninety degrees plus/minus about fifteen degrees (90+/−15 degrees) relative to the inlet and outlet manifolds 20, 21.

In operation, for the arrangement in FIGS. 6-7, the coolant can enter the inlet manifolds 20 from the inlet plenum 22, then flow through the millichannels 125, and finally enter the outlet manifolds 21 to flow out of the base plate 11 from the outlet plenum 23. Thus, the heat generated from the power electronics 100 (shown in FIG. 1) may be removed by the coolant.

Figure 8:
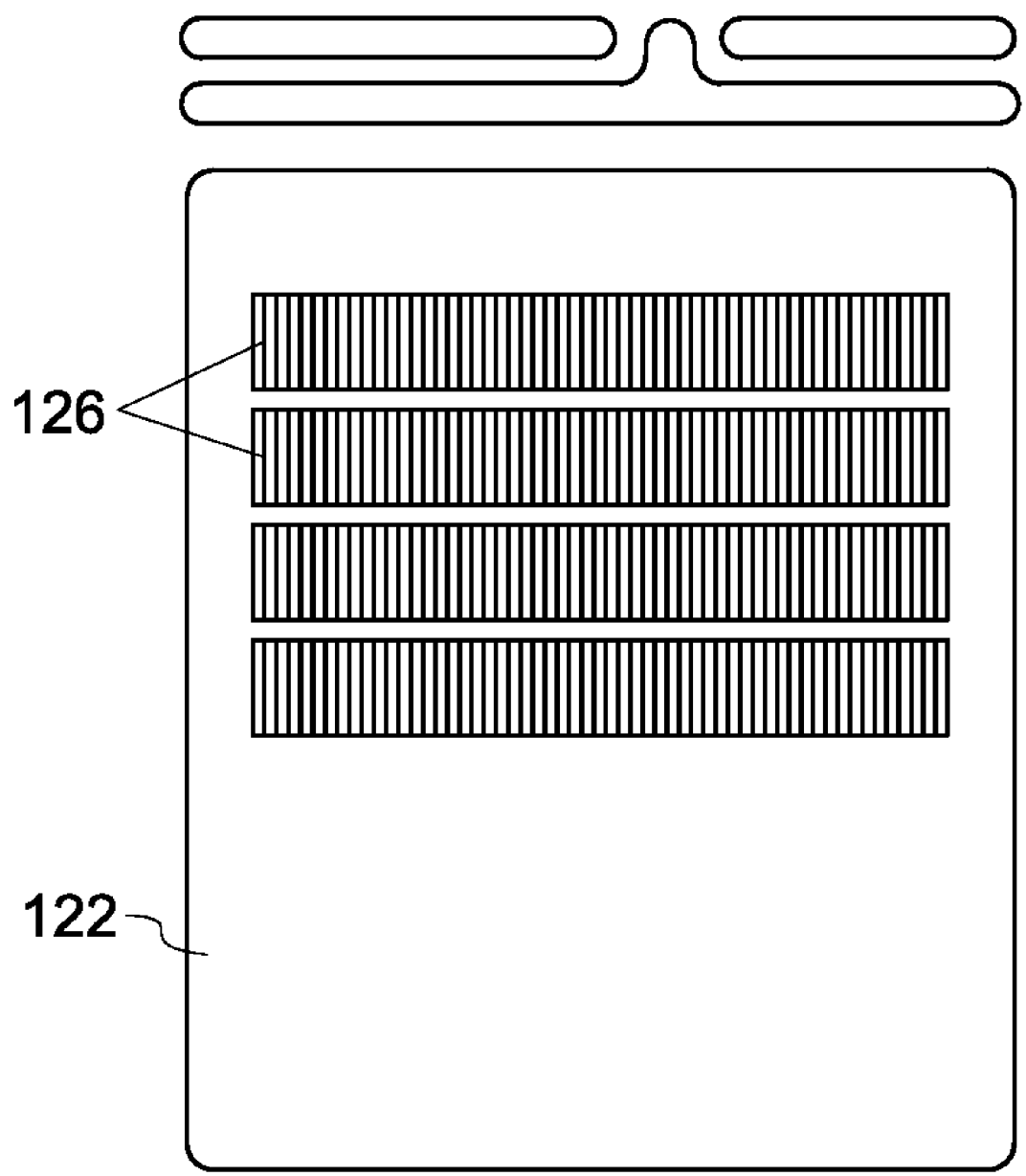
FIG. 8 is a schematic diagram of the lower metal of the substrate in accordance with another embodiment of the invention.

FIG. 8 illustrates a schematic diagram of the lower layer 122 in accordance with another embodiment of the invention. In the illustrated embodiment, the lower layer 122 defines a plurality of millichannels 126 arranged into more than one, such as four groups to cooperate with the base plate 11 to cool the power electronics. The different groups of the millichannels 126 are arranged parallel to and separated with each other, and the millichannels 126 in the same one group are arranged parallel to each other. Lengths and widths of the millichannels 126 in different groups may be the equal. In other examples, the lengths and widths of the millichannels 126 in one group may be different from the lengths and widths of the millichannels 126 in the other group. In certain applications, the millichannels 125-126 may be arranged in different patterns such as angular, arc, zigzag and other patterns depending upon the design criteria. According to more particular embodiments, the channels 20-23, 125-126 are configured to deliver the coolant uniformly to improve thermal removal performance.

In embodiments of the invention, the millichannels 125-126 may include square/rectangular cross sections. Non-limiting examples of cross sections of the millichannels 125-126 may include u-shaped, circular, triangular, or trapezoidal, cross-sections. The millichannels 125-126 may be cast, machined, or etched in the lower layer 122, and may be smooth or rough. The rough millichannels may have relatively larger surface area to enhance turbulence of the coolant so as to augment thermal transfer therein. In non-limiting examples, the millichannels may employ features such as dimples, bumps, or the like therein to increase the roughness thereof. Similarly to the millichannels 125-126, the manifolds 20-21 and the plenums 22-23 may also have a variety of cross-sectional shapes, including but not limited to, round, circular, triangular, trapezoidal, and square/rectangular cross-sections. The channel shape is selected based on the applications and manufacturing constraints and affects the applicable manufacturing methods, as well as coolant flow.

In some embodiments, the substrate 12 may be planar so as to be coupled to the base plate 11 and the power electronics 100 securely. Therefore, when fabricating the substrate 12, deformation of the substrate 12 should be restrained. In some non-limiting examples, the lower layer 122 may be formed with the millichannels 125, 126 before being coupled to the middle layer 120 to prevent the substrate 12 from deformation.

Figure 9:
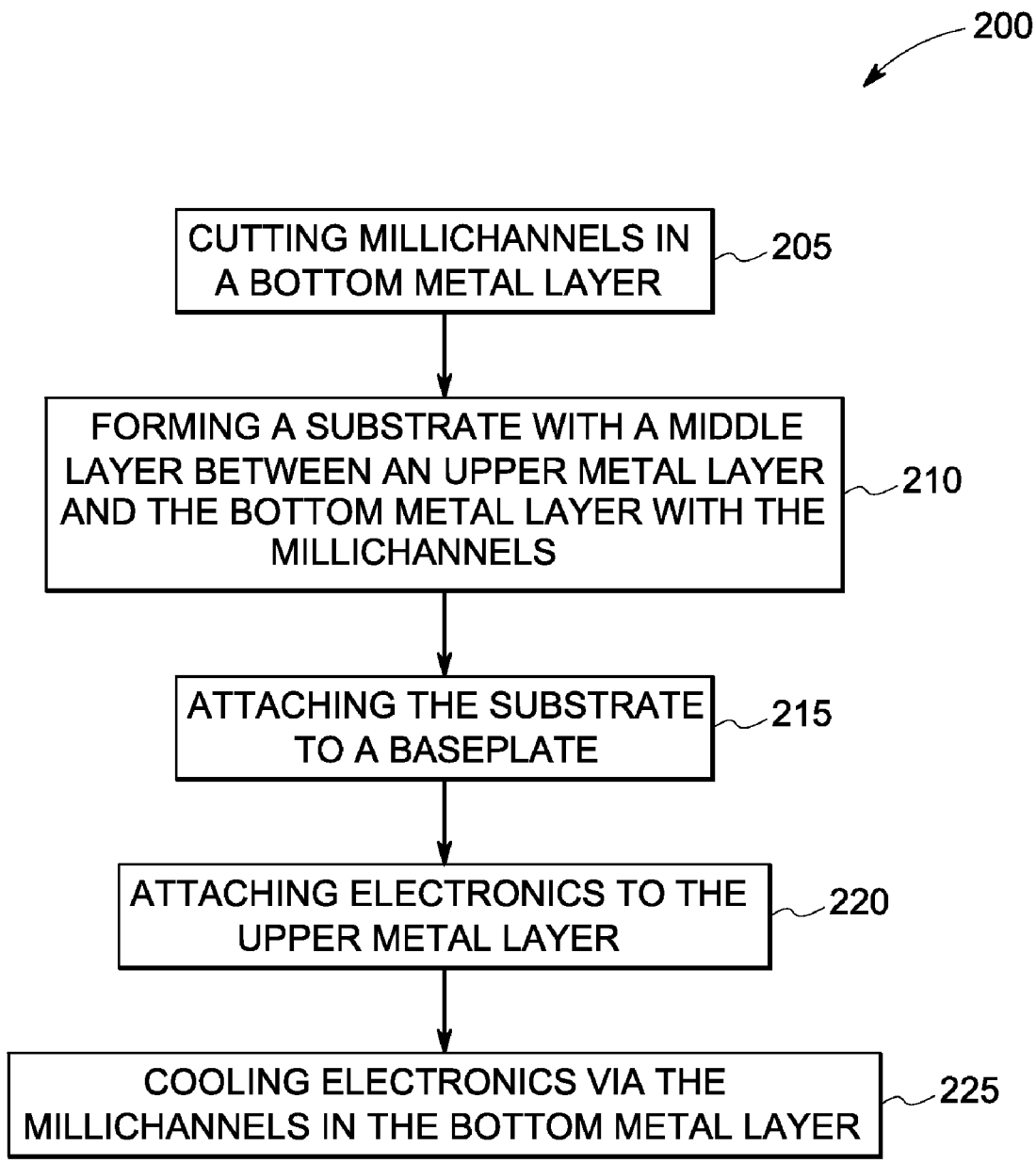
FIG. 9 is a flowchart for forming the apparatus in accordance with one embodiment of the invention.

In one non-limiting example, the substrate 12 may have the direct bonded copper or the active metal braze structure. Accordingly, as described in a flowchart 200 illustrated in FIG. 9, when fabricating the substrate, in step 205, the millichannels are formed on the lower copper layer. Then, in step 210, the lower and upper copper layers are attached to the middle ceramic layer, which is one example is done simultaneously at a high temperature, such as 600° C. to 1000° C.

Alternatively, the lower layer and the upper layer may not be attached to the middle layer simultaneously but serially. Additionally, in certain examples, the upper layer may also define millichannels similar to the lower layer millichannels 125-126. As described herein, the upper and lower layers may include other conductive material such as aluminum, gold, silver, and alloys thereof according to different applications.

Subsequently, in step 215, the substrate is attached to the base plate. In certain embodiments, such as indicated in FIG. 1, a variety of the first solders 13 may be employed to complete the attachment. In some examples, the first solder 13 may comprise a eutectic lead-tin solder including 63 wt % tin and 37 wt % lead. In other examples, the first solder 13 may comprise a hi-lead solder including 92.5 wt % lead, 2.5 wt % silver, and 5 wt % tin. An attachment temperature using the lead-tin solder may be about 210° C., and an attachment temperature using the hi-lead solder may be about 310° C. to complete the attachment of the substrate 12 to the base plate 11.

Finally, in step 220, the power electronics are attached to the upper layer using some type of the second solder 14, which can be implemented by one skilled in the art. Alternatively, in some embodiments, the power electronics may be attached to the substrate before the substrate is attached to the base plate. Thus, in certain embodiments, the millichannels are first formed on the lower layer before the lower layer and the upper layer are coupled to the middle layer so that the deformation of the substrate in the fabrication process may be reduced or eliminated.

In operation, as shown in step 225, the coolant flows through the base plate and also through the millichannels in the substrate thereby cooling the electronics.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A method for making a cooling device, comprising:
defining a plurality of millichannels on a first layer;
forming a substrate, comprising:
attaching the first layer having the millichannels to a lower surface of a second layer, and
attaching a third layer to an upper surface of the second layer; and
attaching the substrate to a base plate so that the first layer is coupled to the base plate, wherein the base plate is configured to cooperate with the substrate to pass a coolant through the millichannels.

2. The method of claim 1, wherein the attaching of the first layer and the third layer to the second layer are done simultaneously.

3. The method of claim 1, wherein the second layer comprises at least one electrically isolating and thermal conductive material, and wherein one or more of the first and third layers comprises at least one conductive material.

4. The method of claim 1, wherein the second layer comprises aluminum nitride (AlN), and wherein one or more of the first and third layers comprises copper.

5. The method of claim 1, wherein the base plate comprises inlet manifolds and outlet manifolds, and wherein the millichannels are configured to receive the coolant from the inlet manifolds and to deliver the coolant to the outlet manifolds.

6. The method of claim 1, further comprising attaching a solder to the base plate before attaching the substrate to the base plate.

7. The method of claim 6, wherein the solder comprises one of a eutectic lead-tin solder and a hi-lead solder.

8. A method for making an apparatus, comprising:
making a substrate comprising:
defining a plurality of millichannels on a first layer;
attaching the first layer having the millichannels to a lower surface of a second layer, and attaching a third layer to an upper surface of the second layer;

attaching the substrate to a base plate so that the first layer is coupled to the base plate, wherein the base plate is configured to cooperate with the substrate to pass a coolant through the millichannels; and attaching a power electronics to the third layer of the substrate.

9. The method of claim 8, wherein the attaching of the first layer and the third layer to the second layer are done simultaneously.

10. The method of claim 8, wherein the second layer comprises at least one electrically isolating and thermal conductive material, and wherein one or more of the first and third layers comprise at least one conductive material.

11. The method of claim 8, wherein the second layer comprises aluminum nitride (AlN), and wherein one or more of the first and third layers comprises copper.

12. The method of claim 8, wherein the base plate comprises inlet manifolds and outlet manifolds, and wherein the millichannels are configured to receive the coolant from the inlet manifolds and to deliver the coolant to the outlet manifolds.

13. The method of claim 8, further comprising attaching of a solder to the base plate before attaching the substrate to the base plate.

14. The method of claim 13, wherein the solder comprises at least one of a eutectic lead-tin solder and a hi-lead solder.

* * * * *